United States Patent

Hashimoto et al.

[11] Patent Number: 5,958,630
[45] Date of Patent: Sep. 28, 1999

[54] PHASE SHIFTING MASK AND METHOD OF MANUFACTURING THE SAME

[75] Inventors: Koji Hashimoto, Yokohama; Tetsuo Matsuda, Takasaki, both of Japan

[73] Assignee: Kabushiki Kaisha Toshiba, Kawasaki, Japan

[21] Appl. No.: 09/000,953

[22] Filed: Dec. 30, 1997

[51] Int. Cl.⁶ .................................................... G03F 9/00
[52] U.S. Cl. .............................................................. 430/5
[58] Field of Search ............................... 430/5, 322, 324; 437/34

[56] References Cited

U.S. PATENT DOCUMENTS

| | | | |
|---|---|---|---|
| 3,924,093 | 12/1975 | Feldman et al. | 219/121 LM |
| 3,934,057 | 1/1976 | Moreau et al. | 427/43 |
| 4,657,843 | 4/1987 | Fukuyama et al. | 430/323 |
| 5,238,787 | 8/1993 | Haluska et al. | 430/325 |
| 5,322,749 | 6/1994 | Han | 430/5 |
| 5,437,947 | 8/1995 | Hur et al. | 430/5 |
| 5,567,550 | 10/1996 | Smayling | 430/5 |
| 5,731,214 | 3/1998 | Kurihara | 437/34 |

*Primary Examiner*—S. Rosasco
*Attorney, Agent, or Firm*—Banner & Witcoff, Ltd.

[57] ABSTRACT

The present invention is directed to the prevention of a decrease in the resolution of a film shifter-type alternating phase shifting mask, and the complexity of the mask forming step, and discusses the structure of a novel alternating phase shifting mask, and a novel manufacturing method which does not require the etching for forming a shifter. To achieve this object, hydrogen silsesquioxane (flowable oxide (FOX)) is used as the material for the phase shifter. The optical characteristics of this film are very close to those of a quartz substrate, and the property that the in-surface variation ($\pm 3\sigma$) of the thickness is 1% or less, is close to that of SOG (Spin On Glass). The most advantageous aspect of the FOX being used for the mask manufacturing process is that, since the FOX film is etched at the same time as the resist development, with the alkaline developing solution used for etching the resist, there is no need to provide a particular step for etching the shifter.

23 Claims, 6 Drawing Sheets

MASK PATTERN

RESIST PATTERN

MASK PATTERN

RESIST PATTERN

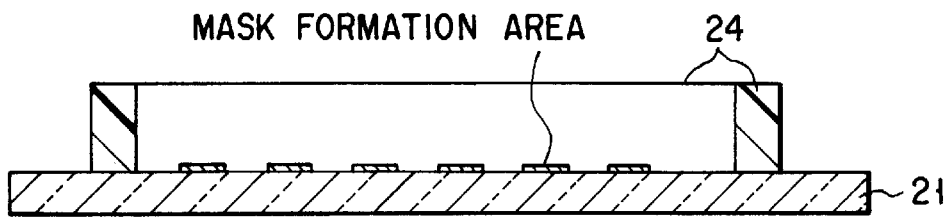
FIG. 8
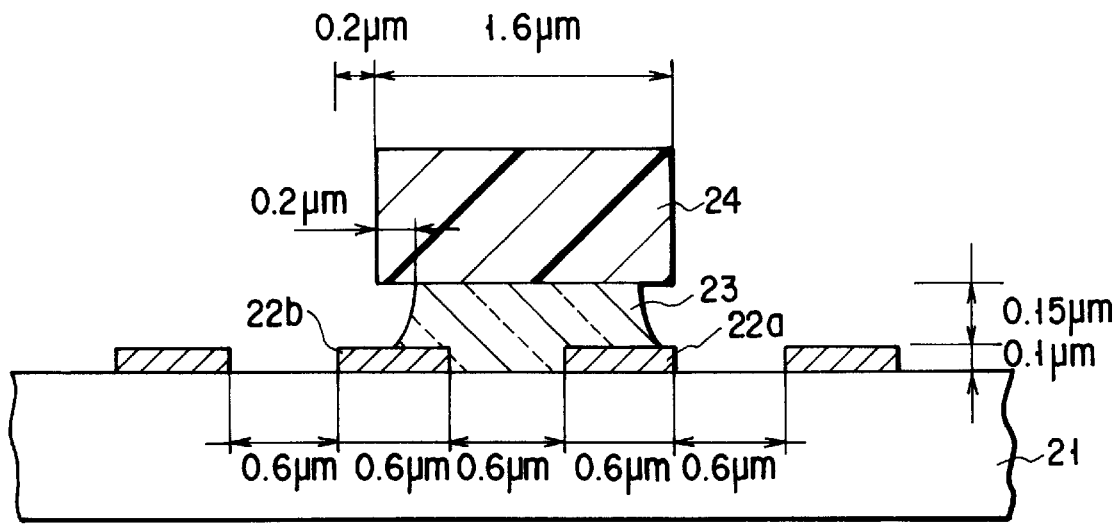
FIG. 9
| | |
|---|---|
| Solids Content Range, percent | to 40 |
| Coating Thickness Range, Å | to 10,000 |
| Thickness Variation (±3σ), percent | <1 |
| Trace Metal Impurities (in solution), ppb | <10 |
| Moisture Absorption, percent | <1 |
| Mechanical Stress Range, dynes/cm$^2$ | $-1 \times 10^8$ to $1 \times 10^9$ |
| Index of Refraction | 1.40 to 1.45 |
| Dielectric Constant at 1 MHz | 3.3 to 4.2 |
FIG. 10

PHASE SHIFTING MASK AND METHOD OF MANUFACTURING THE SAME

BACKGROUND OF THE INVENTION

The present invention relates to a phase shifting mask and a method of manufacturing the same, and more specifically, to an alternating phase shifting mask using a flowable oxide film, in particular, and a method of manufacturing the same.

Of the phase shifting masks, the alternating phase shifting mask is known as one of the effective lithographic techniques capable of achieving a high resolution (for example, M. D. Levenson et al. IEEE Trans. in Electron Devices, Vol. ED-29, No. 12 (1982) p. 1828). However, such a process is completely different from the process for ordinary COG (chromium on glass) masks, and is not easy to achieve.

The alternating phase shift mask can be categorized into mainly two types, in terms of the process for forming the shifter. One is an etched substrate shifter type (subtractive shifter type) such as shown in FIGS. 1A and 2, and the other is a film shifter type (additive shifter type) such as shown in FIGS. 3A and 4. Since it is very difficult to etch quartz, which is the material for the substrate, in an optically ideal etched profile, generally, the former is more difficult to manufacture than the latter.

An alternating phase shifting mask is used generally together with a negative-type resist, in order to avoid unnecessary resist patterns with shifter edge portions. In connection with an etched substrate shifter type mask, when it has a line pattern (island-like pattern) such as shown in FIG. 1A, the section other than the lines is covered by a chromium opaque film. In the line pattern sections (open sections of the opaque film), shifters are alternately provided. A shifter is formed by engraving a substrate as can be seen in FIG. 2. When a negative-type resist on a wafer is developed by an exposure, using the obtained mask, such a resist pattern as shown in FIG. 1A can be obtained.

In the case where the same pattern is formed with the film shifter type mask, shifter films are alternately formed on the opening sections of the chromium opaque film, as shown in FIGS. 3A and 4. In this type, since a shifter section and a non-shifter section are not arranged to be directly adjacent to each other, a shifter film may be extruded out on the opaque film, and with such an allowance, the alignment between the film and opening sections becomes very easy.

The SOG (spin-on-glass) coating on mask, for example, is very popular for the manufacture of film sifter type phase shifting films. This is because the thickness of an SOG film can be easily controlled, and the optical characteristics (especially, refractive index) thereof are close to those of a quartz substrate.

However, even an alternating phase shifting mask which employs such an SOG film entails several drawbacks which render the process thereof very difficult. These drawbacks are mostly concerned with the etching step for removing the SOG film in a non-shifter region.

FIGS. 5A to 5D are cross sectional views showing a process of manufacturing an SOG coating-type alternating phase shifting mask, step by step. First, as shown in FIG. 5A, a chromium opaque film pattern is formed on a quartz substrate 11. Then, an SOG film 13 is formed on the entire surface of the substrate. Subsequently, as shown in FIG. 5C, a resist pattern 14 is formed, and using the resist pattern 14 as a mask, the SOG film 13 is etched, thus forming a phase shifting mask as shown in FIG. 5D. For this etching process, wet etching process or reactive ion etching process are available.

In this case, the quartz substrate 11 may be etched to a certain extent as well during the formation of the non-shifter region 15 for both etching process. This unexpectedly etched portion may generate a shift from the desired phase difference of 180 degree between the shifter region 16 and the non-shifter region 15, which results in an uneven profile of an image intensity as shown in FIG. 5E.

When the image intensity is low, a pattern cannot be formed, or if it is formed, the pattern width is reduced, or a residue remains with the result that a sufficient resolution can not be obtained as a phase shifting mask. This insufficient resolution reduces the process margin with respect to the lithography step in the manufacture of a semiconductor device. This causes, for example, an device error such as short-circuiting of a wiring, which lowers the yield of the product.

In order to avoid such a drawback, a mask forming method as shown in FIGS. 6A to 6D is considered. In this method, an etching stopper (for example, $Al_2O_3$) 17 is formed on the quartz substrate 11. In these figures, the other members which are similar to those shown in FIGS. 5A to 5D, are designated by the same reference numerals, and the duplicated explanations therefor will be omitted since these methods are very close to each other.

However, the mask blank of this kind is very expensive, and an etching damage 18 in a non-shifter region 15 on a stopper 17 may cause an unevenness in the image intensity as shown in FIG. 16.

BRIEF SUMMARY OF THE INVENTION

The object of the present invention is to provide a novel alternating phase shifting mask which does not require an etching process merely for forming a shifter, and a method of manufacturing such a shifting mask.

In order to achieve the above object, there is provided, according to the present invention, a phase shifting mask comprising:

a transparent substrate;

an opaque film formed on the transparent substrate, such as to have a plurality of opening sections which are arranged to be adjacent to each other; and a phase shifter made of hydrogen silsesquioxane, which alternately fills the plurality of opening sections arranged to be adjacent to each other, and is formed on the transparent substrate to have a predetermined film thickness.

Further, in connection with the above shifting mask, it is preferable that the predetermined thickness t of the should satisfy a following formula:

$$t=\lambda/(2(n-1))$$

where t represents the film thickness, $\lambda$ represents the wavelength of an exposure light, and n represents the refractive index of hydrogen silsesquioxane.

Furthermore, it is preferable that the refractive index of the transparent substrate and the refractive index of hydrogen silsesquioxane is substantially equal to each other.

Furthermore, it is preferable that the transparent substrate is made of quartz.

Furthermore, in connection with the above shifting mask, the phase shifter made of hydrogen silsesquioxane is formed to be a mesa type in which the area of the phase shifter occupied at a horizontal surface of an upper surface of the opaque film is larger than that of the upper surface of the phase shifter.

Furthermore, the phase shifting mask of the present invention, may further include a pellicle for protecting a mask, formed to surround and cover a mask forming region of the transparent substrate.

According to the present invention, there is further provided a method of manufacturing a phase shifting mask, including the steps of:

preparing a transparent substrate;

forming an opaque film for substantially shutting off an exposure light, on the transparent substrate;

forming a plurality of opening sections arranged to be adjacent to each other, by patterning the opaque film;

forming a hydrogen silsesquioxane film on the transparent substrate on which the opaque film was formed, so as to have a predetermined thickness on the substrate;

forming a resist on the hydrogen silsesquioxane film;

exposing the resist selectively such that every other resist portions formed on the plurality of opening sections arranged adjacent to each other are exposed in at least a region of the transparent substrate;

removing the exposed ones of the resist portions, and etching only the hydrogen silsesquioxane film situated under the removed resist portions, other than the transparent substrate, at the same time; and removing the remaining resist portion.

In connection with the above-described method, it is preferable that the transparent substrate is a quartz substrate.

Further, it is preferable that the step of forming the opaque film includes a step of sputtering chromium.

Furthermore, it is preferable that the step of forming the hydrogen silsesquioxane film includes a step of spin-coating hydrogen silsesquioxane.

Further, it is preferable that the step of forming the hydrogen silsesquioxane film to have the predetermined thickness, includes a step of adjusting the predetermined thickness t to satisfy a following formula:

$$t=\lambda/(2(n-1))$$

where t represents the film thickness, $\lambda$ represents a wavelength of an exposure light, and n represents a refractive index of hydrogen silsesquioxane.

Furthermore, it is preferable that the step of removing the exposed resist portions, includes a step of etching the hydrogen silsesquioxane film into a mesa form.

Furthermore, it is preferable that the step of removing the exposed resist portions, includes a developing step with use of an alkali developing solution.

Furthermore, it is preferable that the step of removing the remaining resist portion, includes a step of removing the same by an acid treatment.

Furthermore, it is preferable that the just-mentioned acid treatment employs a mixture solution of hydrofluoric acid and hydrogen peroxide solution.

Furthermore, it is possible that the method includes the step of adhering a pellicle to a mask forming surface of the transparent substrate for protection, after the step of removing the remaining resist portion.

As described above, in the present invention, hydrogen silsesquioxane is used as a phase shifter material. This material is commercially available under the name of FOX (Flowable Oxide), a product of Dow Coring Co. The study on the material being applied to semiconductor devices is already started (for example, B. Ahlburn et al., p. 120, 1994, Proceedings of VLSI Multilevel Interconnection Conference (VMIC)).

FIG. 10 is a table listing the typical characteristics of FOX, which is available from Dow Corning Company. The typical refractory index of FOX is in a range from 1.4 to 1.45, and it can be controlled to be around this value by varying the conversion condition. This fact means that the optical characteristics of FOX are very close to those of the quartz substrate made of $SiO_2$. The in-surface variation ($\pm 3\sigma$) of thickness of FOX is 1% or less, and in this respect, FOX is closer to SOG, which enables easy control of a film thickness, an important factor as a phase shifter.

The most advantageous point of FOX when it is applied in the process of manufacturing a mask, is that FOX does not require a shifter etching process. This material is etched at the same time as when the resist pattern (mask pattern) is etched by the alkali developing solution. However, during this period, the quartz substrate is not etched by the alkali developing solution and therefore no damage is caused to the substrate.

In the removal process, FOX has a sufficient margin in the lateral direction, and therefore the process margin for the removal of FOX on the opaque (chromium) pattern can be fully kept.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 8 is a cross sectional view of a mask, to which a pellicle is adhered after the mask is completed;

FIG. 9 is a partial cross sectional view of a mask according to an embodiment of the present invention, designed to explain the process margin for a mask displacement in a lateral direction; and FIG. 10 is a table listing the characteristic values of FOX obtained from its catalog published by the manufacturer.

DETAILED DESCRIPTION OF THE INVENTION

An embodiment of the present invention will now be described with reference to accompanying drawings.

Figure 1A:
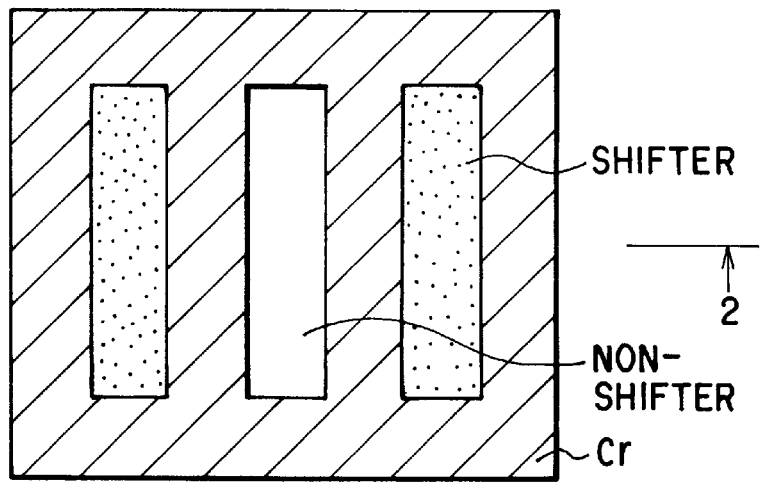
FIG. 1A is an explanatory plan view illustrating the structure of a general etched substrate shifter-type alternating phase shifting mask.
Figure 1B:
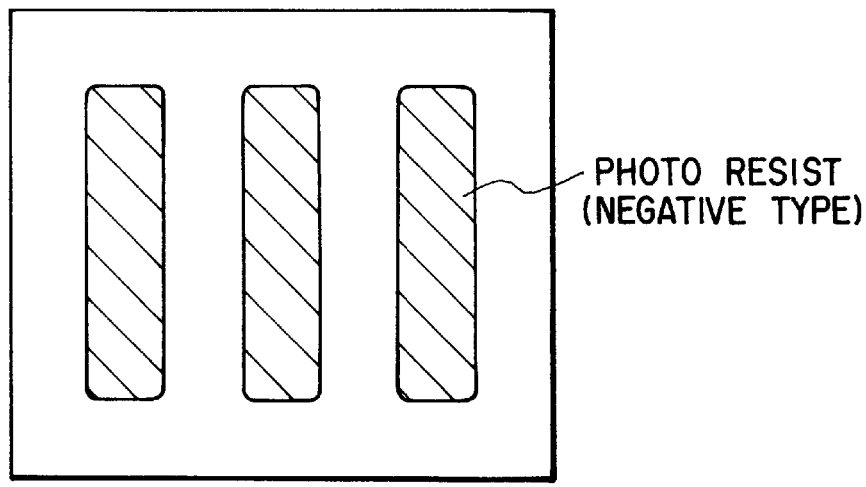
FIG. 1B is a diagram illustrating a negative-type resist pattern formed with use of the mask shown in FIG. 1A.
Figure 2:
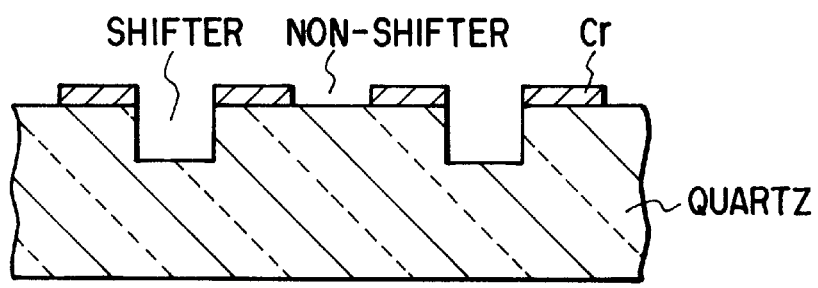
FIG. 2 is a cross sectional view of the mask taken along the line 2—2 of FIG. 1A.
Figure 3A:
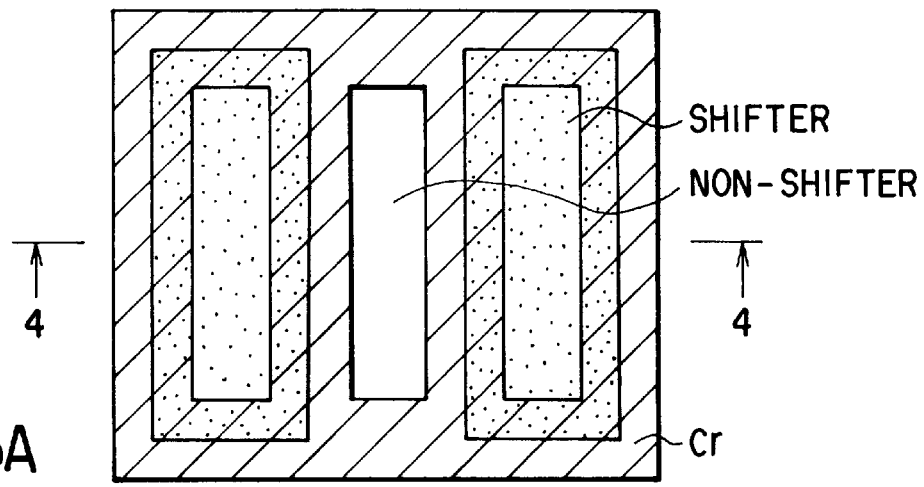
FIG. 3A is an explanatory plan view illustrating the structure of a general film shifter-type alternating phase shifting mask.
Figure 3B:
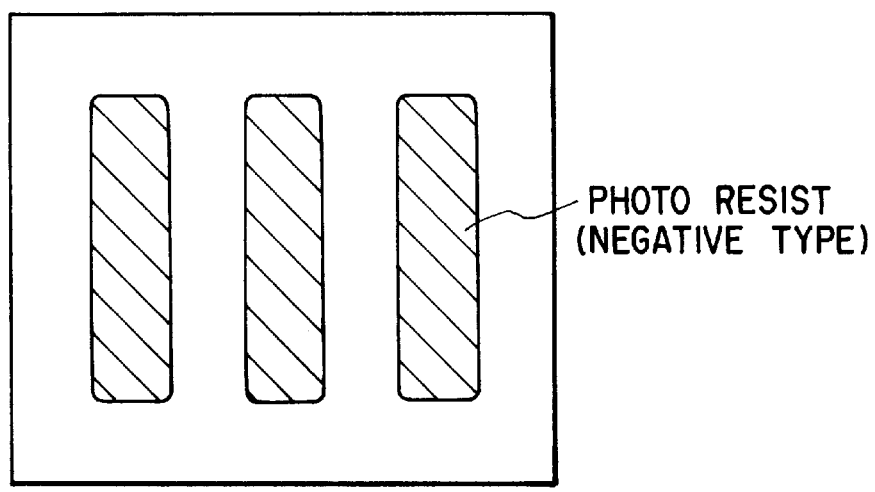
FIG. 3B is a diagram illustrating a negative-type resist pattern formed with use of the mask shown in FIG. 3A.
Figure 4:
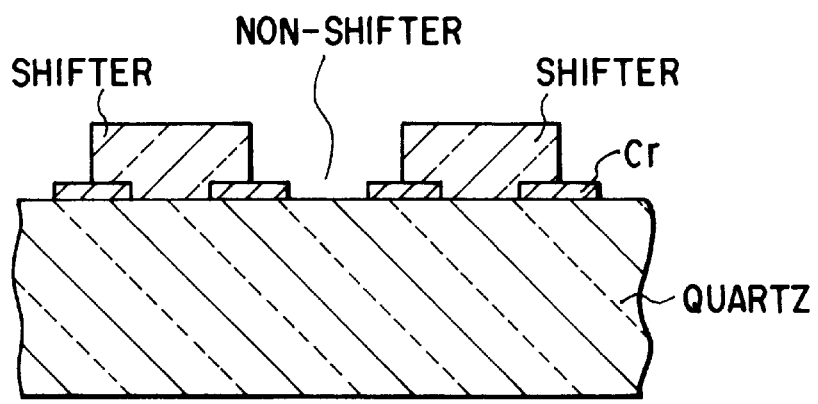
FIG. 4 is a cross sectional view of the mask taken along the line 4—4 of FIG. 3A.
Figure 5A:
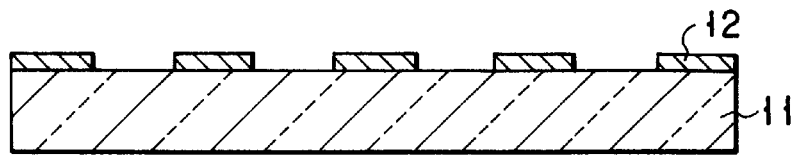
FIGS. 5A to 5D are cross sectional views of a mask, illustrating a process of manufacturing a conventional etched substrate-type mask, step by step, and they are designed to explain the problem entailed in the manufacturing process.
Figure 5B:
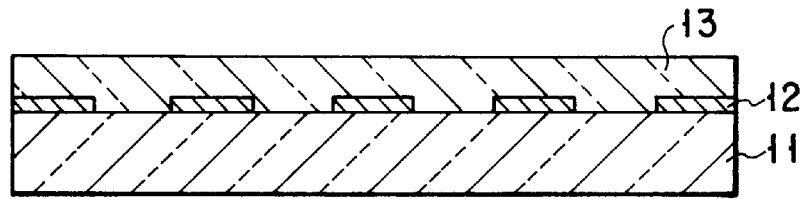
Figure 5C:
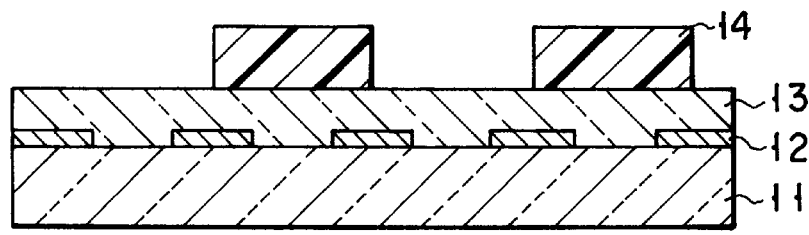
Figure 5D:
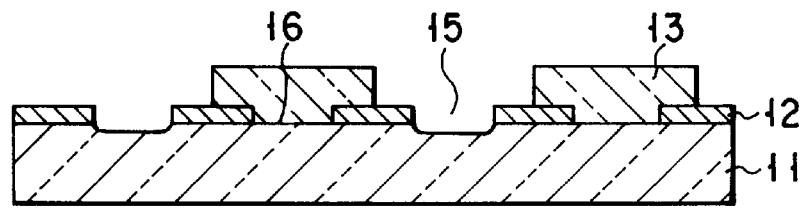
Figure 5E:
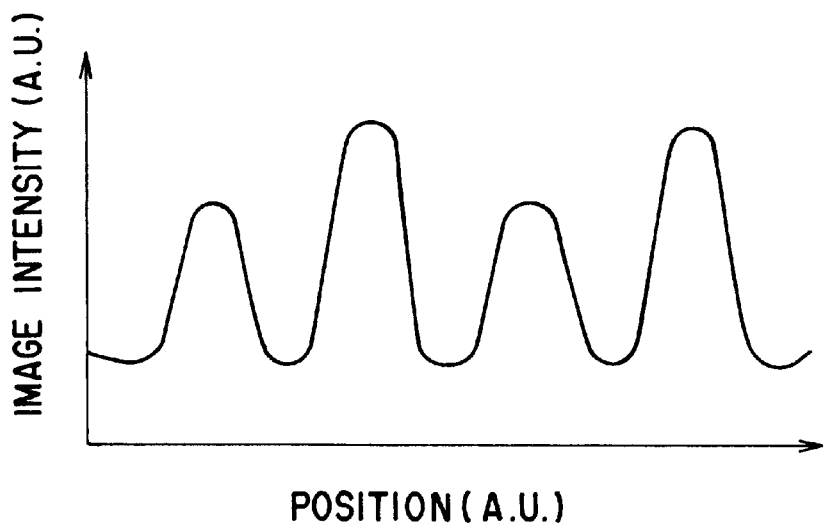
FIG. 5E is a diagram showing an image intensity profile when the mask shown in FIG. 5D is subjected to an exposure.
Figure 6A:
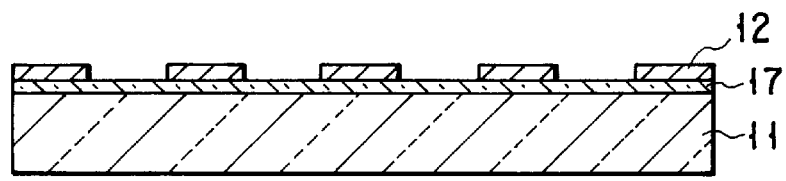
FIGS. 6A to 6D are cross sectional views of a mask, illustrating another process of manufacturing a conventional etched substrate-type mask, step by step, and they are designed to explain the problem entailed in the manufacturing process.
Figure 6B:
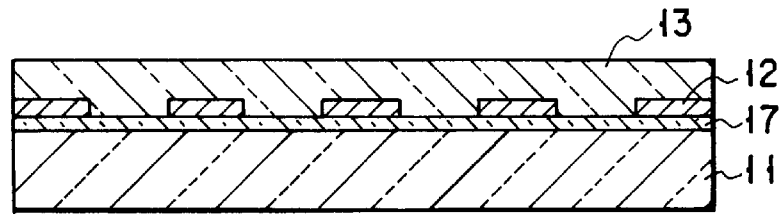
Figure 6C:
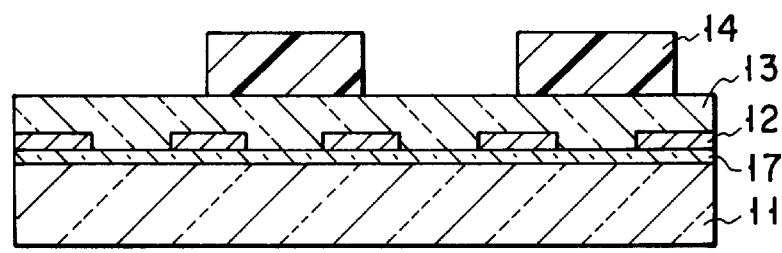
Figure 6D:
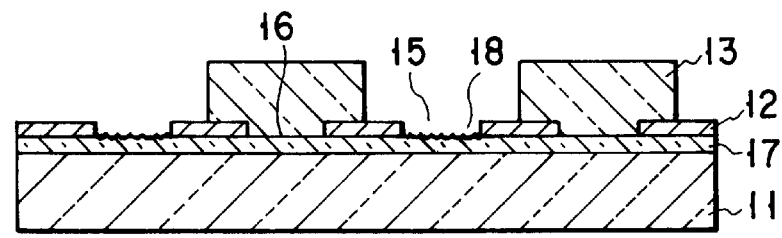
Figure 6E:
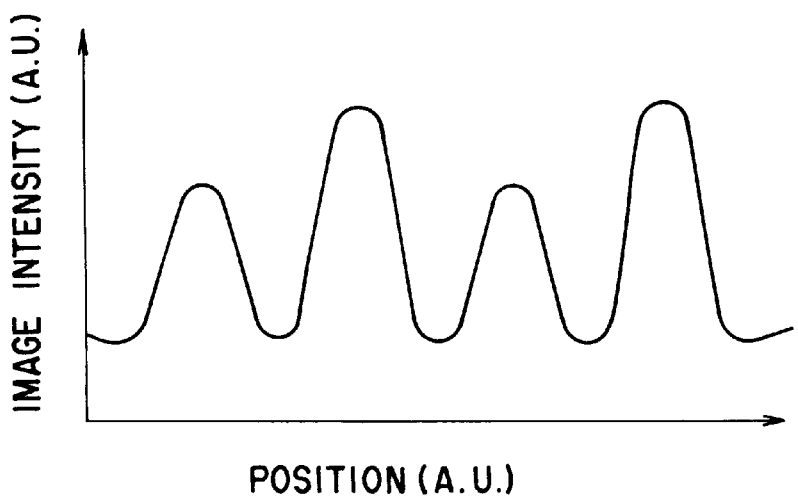
FIG. 6E is a diagram showing an image intensity profile when the mask shown in FIG. 6D is subjected to an exposure.

FIGS. 7A to 7D are cross sectional views of a mask, illustrating the method of manufacturing a shifter deposition type mask according to an embodiment of the present invention, step by step. The mask has the same plan view as that shown in FIG. 3A.

Figure 7A:
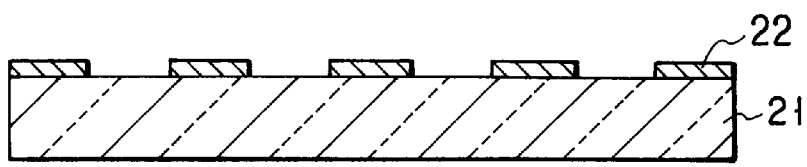
FIGS. 7A to 7D are cross sectional views of a mask, illustrating a process of manufacturing a conventional etched substrate-type mask, step by step.

First, an opaque film pattern 22 is formed on a quartz substrate 21 (FIG. 7A). The opaque film is formed by sputtering, which is a material (chromium etc.) having a sufficient opacity with respect to the wavelength of exposure light, to have a thickness of approximately 0.1 $\mu$m. The opaque film is coated with a resist having a thickness of 1000 nm or less, and then the resist is patterned with use of an electron beam lithography system, thus forming a resist mask. In place of the electron beam lithography system, it is possible to use a laser lithography system which generates i line beam. With use of thus obtained resist mask, the opaque material is wet-etched, thus forming an opaque film pattern 22. In place of wet-etching, a dry-etching technique (for example, reactive ion etching) may be used.

Figure 7B:
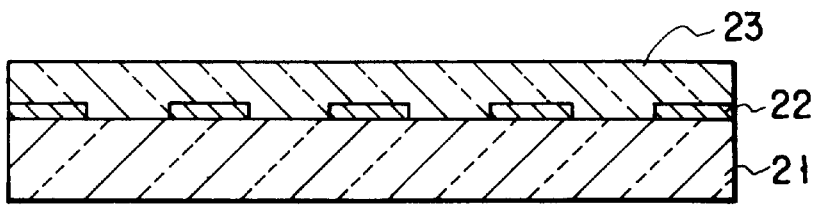
Figure 7C:
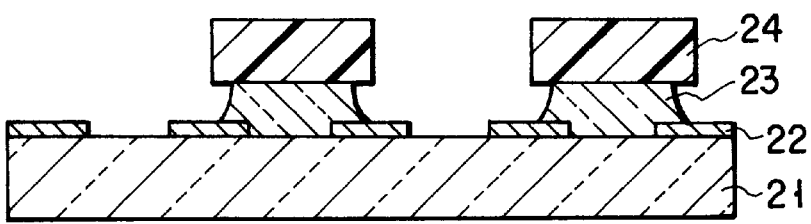
Figure 7D:
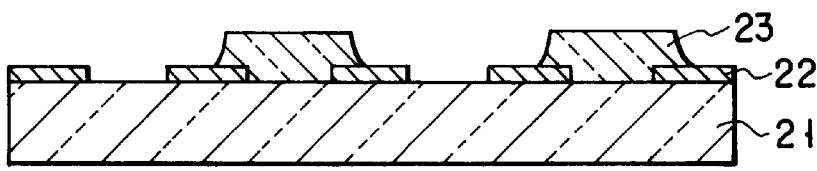
Figure 7E:
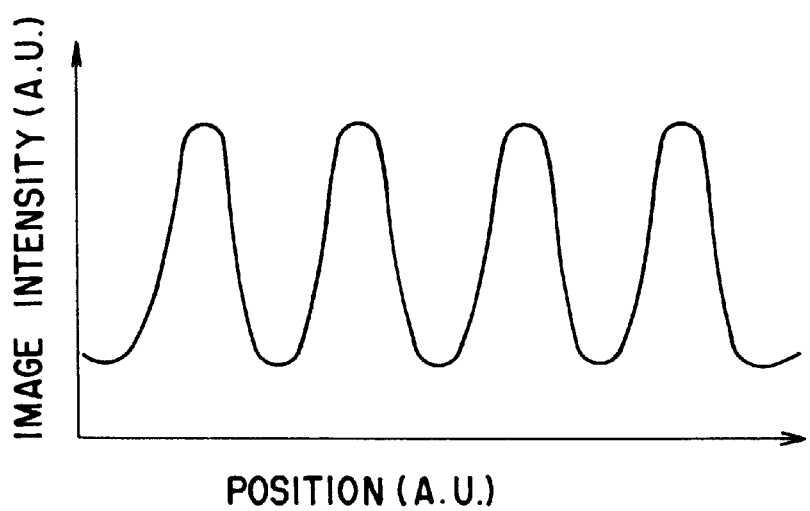
FIG. 7E is a diagram showing an image intensity profile when the mask shown in FIG. 7D is subjected to an exposure.

Next, the entire surface of the mask substrate is coated with a FOX (hydrogen silsesquioxane) film 23 (FIG. 7B). In the embodiment, the FOX film 23 is formed to have a thickness of about 0.25 $\mu$m with a spin coater. Other examples of the coating method for a FOX film, than the above, are dip coating, spray coating and flow coating, and the spin coating is most preferable in terms of the controlling of film thickness. The thickness t of the FOX film 23 depends upon the wavelength of the light used for the exposure, and is determined by the following formula:

$$t=\lambda/(2(n-1))$$

where $\lambda$ represents the wavelength of exposure light and n represents the refractive index of the FOX film at this wavelength. In the case where the wavelength of the exposure light is 248 nm (the light source is KrF), n=1.508, and as the material of the FOX film, a type whose property is adjusted to a value in advance, should be purchased.

Next, a resist 24 is applied on the entire surface of the mask substrate, to have a thickness of 200 to 1000 nm, with use of a spin coater. In the resist 24, the opaque film pattern 22 having openings at every other positions is drawn by an electron beam lithography system. In place of the electron beam lithography system, a laser lithography system may be used to draw a pattern. In this case, the patterning method of the resist requires an alignment to the underlying chromium pattern. The alignment accuracy of a conventional laser lithography system is under 0.1 $\mu$m on a mask.

Then, the resist 24 is wet-etched with use of an alkaline developing solution. The etching solution is applied by a dip coating or spray coating technique. During this wet-etching, the FOX film 23 is etched at the same time by this alkaline developing solution, and the quartz substrate 21 is exposed. This etching is an isotropic etching, and therefore the FOX film 23 is etched into a mesa form. (See FIG. 7C.)

After that, the resist pattern 24 is oxidized with a mixture solution of hydrofluoric acid and hydrogen peroxide solution, and removed. (See FIG. 7D.) It is preferable that the mixture ratio between hydrofluoric acid and hydrogen peroxide solution is 4:1, the temperature is 90° C., and the time period is about 2 minutes. With the oxidization treatment, the quartz substrate 21 and the phase shifter 23 made of FOX will not be damaged.

Thus, an alternating phase shifting mask which uses a FOX film is completed. Further, in order to prevent the adhesion of foreign materials during the product is transported and used in processing, a pellicle made of a frame and a transparent protection film which closes one opening side thereof, is adhered onto the patterned surface of the mask. (See FIG. 8.)

The measurements of the phase shifting mask thus formed are indicated in FIG. 9 which shows a cross section of the mask. In an alternating phase shifting mask for deep ultraviolet rays, as in the above-described embodiment, the thickness of the FOX film is about 0.25 $\mu$m. Let us now suppose a case of four-times-enlarged (4x) mask for a 1 G-bit DRAM of a 0.15 $\mu$m. The most critical size of the mask (for example, the portion corresponding to the width of a line and the interval between adjacent lines, of DRAM) will be: 0.15×4=0.60 $\mu$m. In the case where the width of the resist is 1.6 $\mu$m, the maximum alignment error of the resist is 0.1 $\mu$m, and one end surface of the resist 24 is aligned with an (outer) end surface of the chromium film 22a, (which is the worst case), the displacement between the other end surface of the resist 24 and the outer end surface of the chromium 22b will be 0.2 $\mu$m.

In the meantime, the ratio in the etching rate between the vertical and lateral directions of the FOX film is known to be 2:1 from experiment. Therefore, if the maximum value of the etching amount (in the lateral direction) of the FOX film located underneath the resist is 0.2 $\mu$m due to the process variation, the FOX film can overlap with the chromium film by 0.2 $\mu$m or more, and therefore it is still possible to completely form a phase shifter on the opening of the chromiun film. Thus, a sufficient process margin for the removal of the FOX film on the opaque (chromium) pattern, in the lateral direction, can be obtained.

In an alternating phase shifting mask thus obtained, an image intensity can be obtained uniformly for each of the opening sections of the mask, as shown in FIG. 7, and therefore uniform line-and-space patterns can be obtained on a DRAM.

Additional advantages and modifications will readily occurs to those skilled in the art. Therefore, the invention in its broader aspects is not limited to the specific details and a representative embodiment shown and described herein. Accordingly, various modifications may be made without departing from the spirit or scope of the general inventive concept as defined by the appended claims and their equivalents.

We claim:

1. A phase shifting mask comprising:

a transparent substrate;

an opaque film formed on the transparent substrate, such as to have a plurality of opening sections which are arranged to be adjacent to each other; and a phase shifter made of hydrogen silsesquioxane, which alternately fills the plurality of opening sections arranged to be adjacent to each other, and is formed on the transparent substrate to have a predetermined film thickness.

2. A phase shifting mask according to claim 1, wherein the predetermined thickness satisfies a following formula:

$$t=\lambda/(2(n-1))$$

represents a wavelength of an exposure light, and n represents a refractive index of hydrogen silsesquioxane.

3. A phase shifting mask according to claim 1, wherein a refractive index of a transparent substrate and the refractive index of hydrogen silsesquioxane are substantially equal to each other.

4. A phase shifting mask according to claim 1, wherein the transparent substrate is made of quartz.

5. A phase shifting mask according to claim 1, wherein the phase shifter made of hydrogen silsesquioxane is formed to be a mesa type in which an area of the phase shifter occupied at a horizontal surface of an upper surface of the opaque film is larger than that of an upper surface of the phase shifter.

6. A phase shifting mask comprising:

a transparent substrate;

an opaque film formed on the transparent substrate, such as to have a plurality of opening sections which are arranged to be adjacent to each other;

a phase shifter made of hydrogen silsesquioxane, which alternately fills the plurality of opening sections arranged to be adjacent to each other, and is formed on the transparent substrate to have a predetermined film thickness; and a pellicle for protecting the mask, formed to surround and cover a mask forming region of the transparent substrate.

7. A phase shifting mask according to claim 6, wherein the predetermined thickness satisfies a following formula:

$$t=\lambda/(2(n-1))$$

where t represents the film thickness, $\lambda$ represents a wavelength of an exposure light, and n represents a refractive index of hydrogen silsesquioxane.

8. A phase shifting mask according to claim 7, wherein a refractive index of a transparent substrate and the refractive index of hydrogen silsesquioxane are substantially equal to each other.

9. A phase shifting mask according to claim 8, wherein the transparent substrate is made of quartz.

10. A phase shifting mask according to claim 6, wherein said phase shifter made of hydrogen silsesquioxane is formed to be a mesa type in which the area of the phase shifter occupied at a horizontal surface of an upper surface of the opaque film is larger than that of an upper surface of the phase shifter.

11. A method of manufacturing a phase shifting mask, including the steps of:

preparing a transparent substrate;

forming an opaque film for substantially shutting off an exposure light, on the transparent substrate;

forming a plurality of opening sections arranged to be adjacent to each other, by patterning the opaque film;

forming a hydrogen silsesquioxane film on the transparent substrate on which the opaque film was formed, so as to have a predetermined thickness on the substrate;

forming a resist on the hydrogen silsesquioxane film;

exposing the resist selectively such that every other resist portions formed on the plurality of opening sections arranged adjacent to each other are exposed in at least a region of the transparent substrate;

removing exposed ones of the resist portions, and etching only the hydrogen silsesquioxane film situated under the removed resist portions, other than the transparent substrate, at the same time; and removing the remaining resist portion.

12. A method of manufacturing a phase shifting mask, according to claim 11, wherein the transparent substrate is a quartz substrate.

13. A method of manufacturing a phase shifting mask, according to claim 11, wherein the step of forming the opaque film includes a step of sputtering chromium.

14. A method of manufacturing a phase shifting mask, according to claim 11, wherein the step of forming the hydrogen silsesquioxane film includes a step of spin-coating hydrogen silsesquioxane.

15. A method of manufacturing a phase shifting mask, according to claim 11, wherein the step of forming the hydrogen silsesquioxane film to have the predetermined thickness, includes a step of adjusting the predetermined thickness t to satisfy a following formula:

$$t=\lambda/(2(n-1))$$

where t represents the film thickness, $\lambda$ represents a wavelength of exposure light, and n represents a refractive index of hydrogen silsesquioxane.

16. A method of manufacturing a phase shifting mask, according to claim 11, wherein the step of removing the exposed resist portions, includes a step of etching the hydrogen silsesquioxane film into a mesa form.

17. A method of manufacturing a phase shifting mask, according to claim 11, wherein the step of removing the exposed resist portions, includes a developing step with use of an alkali developing solution.

18. A method of manufacturing a phase shifting mask, according to claim 11, wherein the step of removing the remaining resist portion, includes a step of removing the same by an acid treatment.

19. A method of manufacturing a phase shifting mask, according to claim 18, wherein the acid treatment employs a mixture solution of hydrofluoric acid and hydrogen peroxide solution.

20. A method of manufacturing a phase shifting mask, according to claim 11, wherein the method includes the step of adhering a pellicle to a mask forming surface of the transparent substrate for protection, after the step of removing the remaining resist portion.

21. A phase shifting mask comprising:

a transparent substrate;

an opaque film formed on the transparent substrate, such as to have a plurality of opening sections which are arranged to be adjacent to each other; and a phase shifter made of hydrogen silsesquioxane, which alternately fills the plurality of opening sections arranged to be adjacent to each other.

22. The phase shifting mask of claim 21, further comprising a pellicle for protecting the mask, formed to surround and cover a mask forming region of the transparent substrate.

23. A method of manufacturing a phase shifting mask, including the steps of:

preparing a transparent substrate;

forming an opaque film for substantially shutting off an exposure light, on the transparent substrate;

forming a plurality of opening sections arranged to be adjacent to each other, by patterning the opaque film;

forming a hydrogen silsesquioxane film on the transparent substrate on which the opaque film was formed;

forming a resist on the hydrogen silsesquioxane film;

exposing the resist selectively such that at least some of the other resist portions formed on the plurality of opening sections arranged adjacent to each other are exposed in at least a region of the transparent substrate;

removing exposed ones of the resist portions, and etching the hydrogen silsesquioxane film situated under the removed resist portions; and removing the remaining resist portion.

* * * * *